United States Patent

D'Evelyn et al.

(10) Patent No.: US 8,357,945 B2
(45) Date of Patent: Jan. 22, 2013

(54) GALLIUM NITRIDE CRYSTAL AND METHOD OF MAKING SAME

(75) Inventors: Mark Philip D'Evelyn, Niskayuna, NY (US); Dong-Sil Park, Niskayuna, NY (US); Steven Francis LeBoeuf, Raleigh, NC (US); Larry Burton Rowland, Scotia, NY (US); Kristi Jean Narang, Voorheesville, NY (US); Huicong Hong, Niskayuna, NY (US); Peter Micah Sandvik, Clifton Park, NY (US)

(73) Assignee: Momentive Performance Materials Inc., Albany, NY (US)

( * ) Notice: Subject to any disclaimer, the term of this patent is extended or adjusted under 35 U.S.C. 154(b) by 1412 days.

(21) Appl. No.: 11/588,181

(22) Filed: Oct. 26, 2006

(65) Prior Publication Data

US 2007/0215887 A1 Sep. 20, 2007

Related U.S. Application Data

(63) Continuation-in-part of application No. 11/376,575, filed on Mar. 15, 2006, now abandoned, and a continuation-in-part of application No. 10/329,981, filed on Dec. 27, 2002, now Pat. No. 7,098,487.

(51) Int. Cl.
*H01L 33/00* (2010.01)

(52) U.S. Cl. .......................................... 257/94; 257/103

(58) Field of Classification Search .................... 257/94, 257/103
See application file for complete search history.

(56) References Cited

U.S. PATENT DOCUMENTS

| | | | |
|---|---|---|---|
| 5,637,531 A | 6/1997 | Porowski et al. | |
| 5,962,875 A | 10/1999 | Motoki et al. | |
| 6,273,948 B1 | 8/2001 | Porowski et al. | |
| 6,294,440 B1 | 9/2001 | Tsuda et al. | |
| 6,398,867 B1 | 6/2002 | D'Evelyn et al. | |
| 6,468,882 B2 | 10/2002 | Motoki et al. | |
| 6,521,917 B1 | 2/2003 | Takayama et al. | |
| 6,533,874 B1 | 3/2003 | Vaudo et al. | |
| 6,596,079 B1 | 7/2003 | Vaudo et al. | |
| 6,613,143 B1 | 9/2003 | Melnik et al. | |
| 6,627,552 B1 | 9/2003 | Nishio et al. | |
| 6,806,508 B2 | 10/2004 | D'Evelyn et al. | |
| 6,838,741 B2 | 1/2005 | Sandvik et al. | |
| 6,936,488 B2 | 8/2005 | D'Evelyn et al. | |
| 7,078,731 B2 * | 7/2006 | D'Evelyn et al. | 257/94 |
| 7,098,487 B2 | 8/2006 | D'Evelyn et al. | |
| 2002/0155634 A1 | 10/2002 | D'Evelyn et al. | |

(Continued)

FOREIGN PATENT DOCUMENTS

| | | |
|---|---|---|
| CN | 1345474 | 4/2002 |
| EP | 0 937 790 | 8/1999 |

(Continued)

OTHER PUBLICATIONS

U.S. Appl. No. 11/558,048, filed Nov. 2006, D'Evelyn.

(Continued)

*Primary Examiner* — Long Pham
(74) *Attorney, Agent, or Firm* — Joseph E. Waters

(57) ABSTRACT

There is provided a GaN single crystal at least about 2.75 millimeters in diameter, with a dislocation density less than about $10^4$ cm$^{-1}$, and having substantially no tilt boundaries. A method of forming a GaN single crystal is also disclosed. The method includes providing a nucleation center, a GaN source material, and a GaN solvent in a chamber. The chamber is pressurized. First and second temperature distributions are generated in the chamber such that the solvent is supersaturated in the nucleation region of the chamber. The first and second temperature distributions have different temperature gradients within the chamber.

18 Claims, 3 Drawing Sheets

U.S. PATENT DOCUMENTS

| | | | |
|---|---|---|---|
| 2003/0141301 | A1 | 7/2003 | D'Evelyn et al. |
| 2004/0124435 | A1 | 7/2004 | D'Evelyn et al. |
| 2004/0195598 | A1 | 10/2004 | Tysoe et al. |
| 2004/0245535 | A1 | 12/2004 | D'Evelyn et al. |
| 2005/0029537 | A1 | 2/2005 | D'Evelyn et al. |
| 2005/0087753 | A1* | 4/2005 | D'Evelyn et al. ............... 257/98 |
| 2005/0098095 | A1* | 5/2005 | D'Evelyn et al. ............. 117/105 |
| 2005/0098844 | A1 | 5/2005 | Sandvik et al. |
| 2005/0152820 | A1 | 7/2005 | D'Evelyn et al. |
| 2005/0167692 | A1 | 8/2005 | Ishido et al. |
| 2006/0169996 | A1 | 8/2006 | D'Evelyn et al. |
| 2007/0158785 | A1 | 7/2007 | D'Evelyn |

FOREIGN PATENT DOCUMENTS

| | | |
|---|---|---|
| EP | 0 966 047 | 12/1999 |
| EP | 1 172 464 | 1/2002 |
| EP | 1 249 522 | 10/2002 |
| FR | 2 796 657 | 1/2001 |
| JP | 11 171699 | 9/1999 |
| JP | 200022212 A | 1/2000 |
| JP | 2003 328759 | 11/2008 |
| WO | WO 96/41906 | 12/1996 |
| WO | WO 01/24921 | 4/2001 |
| WO | WO 02/090763 | 11/2002 |
| WO | WO 2004/053206 | 6/2004 |
| WO | WO 2004/053208 | 6/2004 |
| WO | WO 2005/122232 | 12/2005 |

OTHER PUBLICATIONS

U.S. Appl. No. 11/559,146, filed Nov. 2006, D'Evelyn.
U.S. Appl. No. 11/621,556, filed Jan. 2007, D'Evelyn.
U.S. Appl. No. 11/356,575, filed Mar. 2006, D'Evelyn.
U.S. Appl. No. 11/376,640, filed Mar. 2006, D'Evelyn.
U.S. Appl. No. 11/621,560, filed Jan. 2007, D'Evelyn.
H. Jacobs et al., "*High-Pressure Ammonolysis in Solid-State Chemistry*", Current Topics in Materials Science, vol. 8, edited by E. Kaldis, North-Holland Publishing Company, Chapter 5, pp. 383-427, 1982.
R. Dwilinski et al., "GaN synthesis by Ammonothermal Method", *Acta Physical Poloncia A.*, vol. 88, No. 5, pp. 833-836, 1995.
R. Dwilinski et al., "On GaN Crystallization by Ammonothermal Method", *Acta Physica Polonica A.*, vol. 90, No. 4, pp. 763-766, 1996.
Joseph W. Kolis et al., "Materials Chemistry and Bulk Crystal Growth of Group III Nitrides in Supercritical Ammonia",*Mat. Res. Soc. Symp. Proc.*, vol. 495, pp. 367-372, 1998.
R. Dwilinski et al., Ammono Method of BN, AIN and GaN Synthesis and Crystal Growth, *MRS Internet Journal Nitride Semiconductor Research 3*, Article 25, pp. 1-4, 1998.
R. Dwilinski et al., Ammono Method of GaN and AlN Production,*Elsevier Science, Diamond and Related Materials*, vol. 7, pp. 1348-1350, 1998.
J.I. Pankove et al., "*Molecular Doping of Gallium Nitride*", Applied Physics Letters, vol. 74, No. 3, pp. 416-418, 1999.
S. Porowski, "*Near Defect Free GaN Substrates*", MRS Internet Journal Nitride Semiconductor Research 4S1, Article G1.3, 1999.
T. Hino et al., "*Characterization of Threading Dislocations in GaN Epitaxial Layers*", Applied Physics Letters, vol. 76, No. 25, American Institute of Physics, pp. 3421-3423, 2000.
Douglas R. Ketchum et al., "*Crystal Growth of Gallium Nitride in Supercritical Ammonia*", Elsevier, Journal of Crystal Growth, vol. 222, pp. 431-434, 2001.
Balaji Raghothamachar et al., "*Synchrotron White Beam Topography Characterization of Physical Vapor Transport Grown AIN and Ammonothermal GaN*", Elsevier, Journal of Crystal Growth, vol. 246, pp. 271-280, 2002.
S. K. Hong et al., "*Evaluation of Nanopipes in MOCVD Grown (0001) GaN/Al$_2$O$_3$ By Wet Chemical Etching*", Elsevier, Journal of Crystal Growth, vol. 191, pp. 275-278, 1998.
R. Dwilinski et al., "Exciton Photo-Luminescence of GaN Bulk Crystals Grown by the AMMONO Method", Elsevier Science S.A., Materials Science and Engineering, vol. B50, pp. 46-49, Dec. 19, 1997.
Andrew D. Hanser et al., "Growth, Doping and Characterization of Epitaxial Thin Films and Patterned Structures of AlN, GaN, and Al$_x$Ga$_{1-x}$N", Elsevier Science S.A., Diamond and Related Materials, vol. 8, pp. 288-294, Mar. 1999.
Yu V. Melnik et al:, "Structural Properties of GaN Grown on SiC Substrates by Hydride Vapor Phase Epitaxy", Elsevier Science S.A., Diamond and Related Materials, vol. 6, pp. 11532-1535, 1997.
T. Paskove et al., "Domain Structure of Thick GaN Layers Grown by Hydride Vapor Phase Epitaxy", MRS Internet J. Nitride Semicond. Res. 4S1, G3.16, 6 pages, 1999.
I. Grzegory et al., "GaN Crystals: Growth and Doping Under Pressure", Mat. Res. Soc. Symp. Proc., High Pressure Research Center Polish Academy of Sciences, Warsaw, Poland, vol. 482, pp. 15-26, 1998.
T. Sushi et al., "Properties of Bulk Gallium Nitride Crystals", Electrochemical Society Proceedings, UNIPRESS, Polish Academy of Sciences, Sokolowska, Warszawa, Poland, vol. 96-11, pp. 46-57.
S. Porowski et al., "High Resistivity GaN Single Crystalline Substrates", Proceedings of the XXVI International School of Semiconducting Compounds, Jaszowiec, Warsaw, Poland, ACTA Physica Polonica A, vol. 92, No. 5, pp. 958-962, 1997.
T. Sushi et al., "High Pressure Fabrication and Processing of GaN: Mg", UNIPRESS, High Pressure Research Center, Polish Academy of Sciences, Warszawa, Poland, Elsevier Science S.A., Materials Science and Engineering, vol. B59, pp. 1-5, 1999.
E. Frayssinet et al., "Evidence of Free Carrier Concentration Gradient Along the c-axis for Undoped GaN Single Crystals", UNIPRESS, High Pressure Research Center, Polish Academy of Sciences, Warszawa, Poland, Elsevier Science S.A., Elsevier Science S.A., Journal of Cyrstal Growth, vol. 230, pp. 442-447, 2001.
M. Lefeld-Sosnowska et al., "Extended Defects in GaN Single Crystals", Institute of Experimental Physics, University of Warsaw, Poland, Journal of Physics D: Applied Physics, vol. 34, pp. A148-A150, 2001.
S. Krukowski, "Thermodynamics and High-Pressure Growth of (Al, Ga, In)N Single Crystals", Elsevier Science S.A., High Pressure Research Center, Polish Academy of Sciences, Sokolowska, Warsaw, Poland, Diamond and Related Materials, vol. 6, pp. 1515-1523, 1997.
M. Leszczynski et al, "The Microstructure of Gallium Nitride Monocrystals Grown at High Pressure", Elsevier Science S.A., High Pressure Research Center, Polish Academy of Sciences, Sokolowska, Warsaw, Poland, Journal of Crystal Growth, vol. 169, pp. 235-242, 1996.
M. Leszczynski et al, "Lattice Parameters of Gallium Nitride", High Pressure Research Center, Polish Academy of Sciences, Sokolowska, Warsaw, Poland, American Institute of Physics, Appl. Phys. Lett., vol. 69, No. 1, pp. 73-75, Jul. 1996.
H. Morkoc, "Comprehensive Characterization of Hydride VPE Grown GaN Layers and Templates", Elsevier Science B.V., Department of Electrical Engineering and Physics Department, Virginia Commonwealth University, Richmond, VA, Materials Science and Engineering, Reports: A Review Journal, vol. R33, pp. 135-207, 2001.
F. Yun et al., "Electrical, Structural, and Optical Characterization of Free-Standing GaN Template Grown by Hydride Vapor Phase Epitaxy", Elsevier Science Ltd., Department of Electrical Engineering and Department of Physics, Virginia Commonwealth University, Richmond,VA, Pergamon, Solid-State Electronics, vol. 44, pp. 2225-2232, 2000.
J. A. Freitas, Jr., et al., "Structural and Optical Properties of Thick Freestanding GaN Templates", Elsevier Science B.V., Journal of Crystal Growth, vol. 231, pp. 322-328, 2001.
Sung S. Park et al., "Free-Standing GaN Substrates by Hydride Vapor Phase Epitaxy", Japan Journal of Applied Physics, vol. 39, Part 2, No. 11B, pp. L1141-L1142, Nov. 15, 2000.
S. K. Mathis et al., "Modeling of Threading Dislocation Reduction in Growing GaN Layers", Phys. Stat. Sol. vol. (a) 179, pp. 125-145, 2000.
Yoshinobu Ono et al., "Reduction of Etch Pit Density on GaN by InGaN-Strained SQW", Elsevier Science B.V., Journal of Crystal Growth, vols. 189/190, pp. 133-137, 1998.
P. Visconti et al., "Investigation of Defects and Polarity in GaN Using Hot Wet Etching, Atomic Force and Transmission Electron Microscopy and Convergent Beam Electron Diffraction", Phys. Stat.Sol. vol. (b) 228, No. 2, pp. 513-517, 2001.

P. Visconti et al., "Dislocation Density in GaN Determined by Photoelectrochemical and Hot-Wet Etching", American Institute of Physics, Applied Physics Letters, vol. 77, No. 22, pp. 3532-3534, 2000.

Xueping Xu et al., "Growth and Characterization of Low Defect GaN by Hydride Vapor Phase Epitaxy", Elsevier Science V.B., Journal of Crystal Growth, vol. 246, pp. 223-229, 2002.

R. P. Vaudo et al., "GaN Boule Growth: A Pathway to GaN Wafers With Improved Material Quality", Phys. Stat. Sol., vol. (a) 194, No. 2, pp. 494-497, 2002.

D. Hanser et al., "Growth and Fabrication of 2 Inch Free-Standing GaN Substrates via the Boule Growth Method", Mat. Res. Soc. Symp. Proc., vol. 798, pp. Y2.1.1-Y.2.1.6, 2004.

V. Dmitriev et al., "Properties of GaN Homoepitaxial Layers Grown on GaN Epitaxial Wafers", Mat. Res. Soc. Symp. Proc., vol. 512, pp. 451-456, 1998.

Richard J. Molnar, "Hydride Vapor Phase Epitaxial Growth of III-V Nitrides", Galliumn Nitride, (GaN) II, Semiconductors and Semimetals, vol. 57, pp. 1-31, 1999.

Masashi Hasegawa et al., "Growth of Nitride Crystals in a Supercritical Nitrogen Fluid Under High Pressures and High Temperatures Yield Using Diamond Anvil Cell and YAG Laser Heating", Elsevier Science B.V., Journal of Crystal Growth 217, pp. 349-354, 2000.

K. Byrappa et al., "A Technology for Crystal Growth and Materials Processing", Handbook of Hydrothermal Technology, Uniersity of Mysore Manasagangotri, Mysore, India, Apparatus, pp. 82-160, 2001.

Pedro Gomez-Romero, "Hybrid Organic-Inorganic Materials-In Search of Synergic Activity", Advanced Materials, vol. 13, No. 3, pp. 163-174, Feb. 5, 2001.

Guido Kickelbick et al., "Inorganice Clusters in Organic Polymers and the Use of Polyfunctional Inorganic Compounds as Polymerization Initiators", Monatshefte für Chemie, vol. 132, pp. 13-30, 2001.

Helmut K. Schmidt, "Synthesis and Application of Inorganic/Organic Composite Materials", Macromol. Symp., vol. 101, pp. 333-342, 1996.

S. Porowski et al., "GaN Crystals Grown in the Increased Volume High Pressure Reactors", Mat. Res. Soc. Symp. Proc., vol. 449, High Pressure Research Center Polish Academy of Sciences, Warsaw, Poland, pp. 35-40, 1997.

Jeffrey Pyun et al., "Synthesis of Nanocomposite Organic/Inorganic Hybrid Materials Using Controlled/Living Radical Polymerization", American Chemical Society, Chem. Mater., vol. 13, pp. 3436-3448, 2001.

Abandoned U.S. Appl. No. 09/694,690, filed Oct. 23, 2000, entitled "Homoepitaxial Callium-Nitride-Based Light Emitting Device and Method for Producing".

Co-Pending U.S. Appl. No. 09/683,658, filed Jan. 31, 2002, entitled "Improved Pressure Vessel".

* cited by examiner

GALLIUM NITRIDE CRYSTAL AND METHOD OF MAKING SAME

CROSS REFERENCE TO RELATED APPLICATIONS

This application is a continuation-in-part of application Ser. No. 11/376,575, filed on Mar. 15, 2006 and of U.S. Pat. No. 7,098,487 issued on Aug. 29, 2006. This application claims priority to and benefit from the foregoing, the disclosures of which are incorporated herein by reference.

STATEMENT REGARDING FEDERALLY SPONSORED RESEARCH & DEVELOPMENT

The United States Government may have certain rights in this invention pursuant to Cooperative Agreement No. 70NANB9H3020, awarded by the National Institute of Standards and Technology, United States Department of Commerce.

BACKGROUND OF THE INVENTION

This invention is related generally to a high quality gallium nitride single crystal and a method of making the same.

FIELD OF THE INVENTION

Gallium nitride (GaN) based optoelectronic and electronic devices are of tremendous commercial importance. However, the quality and reliability of these devices is compromised by very high defect levels, particularly threading dislocations in semiconductor layers of the devices. These dislocations can arise from lattice mismatch of GaN based semiconductor layers to a non-GaN substrate such as sapphire or silicon carbide. Additional defects can arise from thermal expansion mismatch, impurities, and tilt boundaries, depending on the details of the growth method of the layers.

The presence of defects has a deleterious effect on epitaxially-grown layers, compromising electronic device performance and requiring complex, tedious fabrication steps to reduce the concentration and/or impact of the defects. While a substantial number of growth methods for gallium nitride crystals have been proposed, the methods to date still merit improvement.

U.S. Pat. Nos. 5,637,531 and 6,273,948 disclose methods for growing gallium nitride crystals at high pressure and high temperature, using liquid gallium and gallium-based alloys as a solvent and a high pressure of nitrogen above the melt to maintain GaN as a thermodynamically-stable phase. The process is capable of growing electrically-conductive GaN crystals with a dislocation density of about $10^3$-$10^5$ cm$^{-2}$ or, alternatively, semi-insulating GaN crystals with a dislocation density of about 10-$10^4$ cm$^{-2}$, as described by Porowski, "Near defect-free GaN substrates" [MRS Internet J. Nitride Semicond. Research 4S1, G1.3 (1999)].

The conductive crystals, however, have a high concentration of n-type defects, on the order of $5\times10^{19}$ cm$^{-3}$. These defects are believed to comprise oxygen impurities and nitrogen vacancies. As a consequence, the crystals are relatively opaque, with an absorption coefficient of about 200 cm$^{-1}$ at wavelengths in the visible portion of the spectrum. As a consequence, up to half the light emitted by a light emitting diode (LED) fabricated on such a crystal is absorbed by the substrate. This constitutes a large disadvantage compared to conventional heteroepitaxial LEDs fabricated on sapphire or transparent SiC substrates. Further, the high concentration of n-type defects in nominally undoped crystals grown in molten Ga causes the lattice constant to increase by about 0.01-0.02%, which generates strain in undoped epitaxial GaN layers deposited thereupon. Additionally, the undoped GaN substrates formed by this method have a rather limited carrier mobility, about 30-90 cm$^2$/V-s, which may be limiting in high-power devices.

The transparency and dislocation density of GaN crystals grown in liquid Ga may be improved by the addition of Mg or Be to the growth medium, but the crystals so produced are semi-insulating, with a resistivity above about $10^5$ Ω-cm. Such crystals are not appropriate for vertical devices in which one electrical contact is made to the substrate itself.

The most mature technology for growth of pseudo-bulk or bulk GaN is hydride/halide vapor phase epitaxy, also known as HVPE. In the most-widely applied approach, HCl reacts with liquid Ga to form vapor-phase GaCl, which is transported to a substrate where it reacts with injected $NH_3$ to form GaN. Typically the deposition is performed on a non-GaN substrate such as sapphire, silicon, gallium arsenide, or $LiGaO_2$. The dislocation density in HVPE-grown films is initially quite high, on the order of $10^{10}$ cm$^{-2}$ as is typical for heteroepitaxy of GaN, but drops to a value of about $10^7$ cm$^{-2}$ after a thickness of 100-300 μm of GaN has been grown.

HVPE may be capable of reducing defect levels further in thicker films, but values below $10^4$ cm$^{-2}$ over an entire wafer seem unlikely. In addition, strain is present in HVPE wafers due to the thermal expansion mismatch between substrate and film. This strain produces bowing upon cool down of the substrate and film after growth, which remains even after removal of the original substrate.

For reasons that are not yet understood, in thick HVPE GaN neither absorption nor emission of light at room temperature occurs with a threshold at the band edge. In transmission spectroscopy, HVPE GaN absorbs with a cutoff near 370 nm, significantly shifted from the expected cutoff near 366 nm. Similarly, the photoluminescence peak at room temperature occurs at 3.35 eV, at significantly lower energy than expected. This behavior will compromise the performance of light emitting devices operating in the ultraviolet, as some of the light will be absorbed by the substrate rather than being emitted. The shifted photoluminescence peak indicates the presence of defect states that may compromise device performance.

Other widely-applied methods for growth of large area, low-dislocation-density GaN are variously referred to as epitaxial lateral overgrowth (ELO or ELOG), lateral epitaxial overgrowth (LEO), selective area growth (SAG), dislocation elimination by epitaxial growth with inverse pyramidal pits (DEEP), or the like. In the case of all variations of this method, heteroepitaxial GaN growth is initiated in a one- or two-dimensional array of locations on a substrate, where the locations are separated by a mask, trenches, or the like. The individual GaN crystallites grow and then coalesce. Epitaxial growth is then continued on top of the coalesced GaN material to produce a thick film or "ingot." Typically, the thick GaN layer formed on the coalesced GaN material is deposited by HVPE.

This process is capable of large reductions in the concentration of dislocations, particularly in the regions above the mask. However, the resulting GaN substrate is not a true single crystal although a number of authors do refer to ELO structures as single crystals. Each individual GaN crystallite constitutes a grain, and there is typically a low-angle grain boundary or a tilt boundary at the points where the grains coalesce. The low-angle or tilt boundaries are manifested as an array of edge dislocations, and generate lateral strain within the GaN. The magnitude of the crystallographic tilting depends on the details of the masking and growth conditions, but there is generally at least a low level of tilting associated with grain coalescence. Much or most of the crystallographic tilting forms directly during growth, rather than simply, being a consequence of thermal expansion mismatch.

The tilt-grain-boundary structure and lateral strain persists throughout an entire ingot and therefore into each substrate sliced from this ingot. In other words, no substrate sliced from such an ingot will be a true single crystal, free of tilt boundaries and lateral strain. In addition, the GaN substrate is likely to suffer from the same deficiencies in UV absorption and photoluminescence at room temperature as "standard" HVPE GaN.

Other methods for crystal growth of GaN involve the use of supercritical ammonia as a solvent. Several groups have reported growth of very small GaN crystals in supercritical ammonia, notably Kolis et al. in "Materials Chemistry and Bulk Crystal Growth of Group III Nitrides in Supercritical Ammonia", Mater. Res. Soc. Symp. Proc. 495, 367 (1998)]; "Crystal Growth of Gallium Nitride in Supercritical Ammonia", J. Cryst. Growth 222, 431 (2001); "Synchrotron white beam topography characterization of physical vapor transport grown AlN and ammonothermal GaN", J. Cryst. Growth 246, 271 (2002); and Dwilinski et al. in "AMMONO Method of GaN and AlN Production", Diamond Relat. Mater. 7, 1348 (1998); "AMMONO Method of BN, AlN, and GaN Synthesis and Crystal Growth", MRS Internet J. Nitride Semiconductor Res. 3, article 25 (1997); "On GaN Crystallization by Ammonothermal Method" Acta Phys. Pol. A 90, 763 (1996); and "GaN Synthesis by Ammonothermal Method" Acta Phys. Polonica A 88, 833 (1995)]. However, only small crystals or mm-sized crystals of rather poor quality have been reported to date. In addition, these authors do not disclose the use of temperature gradient profiles to optimize growth on seeds.

French patent FR 2,796,657 to Demazeau et al. discloses a method for GaN growth in supercritical ammonia or hydrazine at pressures of 0.05-20 kbar, temperatures of 100-600° C., and a temperature gradient of 10-100° C. The only apparatus taught by Demazeau to access these conditions is a Tuttle-type cold-seal pressure vessel, which is well known in the art and is limited to a maximum pressure of 5-6 kbar. Standard pressure vessels are limited to a pressure of about 5-6 kbar when working with $NH_3$, as discussed by Jacobs and Schmidt in "High Pressure Ammonolysis in Solid-State Chemistry", *Curr. Topics Mater. Sci.* 8, ed. by E Kaldis (North-Holland, 1982)], limiting the maximum temperature, reaction rate, and, in all likelihood, crystalline quality. Therefore, Demazeau discloses no method capable of reaching the higher pressure range, and does not demonstrate GaN crystals larger than 1 mm in size. In addition, Demazeau does not teach the use of temperature gradient profiles to optimize growth on seeds.

U.S. Pat. No. 6,398,867 to D'Evelyn et al. discloses a method for temperature gradient recrystallization of GaN in a supercritical fluid at a pressure greater than 5 kbar, a temperature greater than 550° C., with a temperature gradient of 5-300° C.

SUMMARY OF THE INVENTION

In accordance with one aspect of the present invention, there is provided a GaN single crystal at least about 2.75 millimeters in diameter, with a dislocation density less than about $10^4$ cm$^{-1}$, and being substantially free of tilt boundaries.

In accordance with another aspect of the present invention, there is provided a GaN single crystal at least about 2 millimeters in diameter, and having no tilt boundaries, wherein the single crystal has a photoluminescence spectrum which peaks at a photon energy of between about 3.38 and about 3.41 eV at a crystal temperature of 300° C.

In accordance with another aspect of the present invention, there is provided a method of forming a GaN single crystal. The method comprises (a) providing a nucleation center in a first region of a chamber; (b) providing a GaN source material in a second region of the chamber; (c) providing a GaN solvent in the chamber; (d) pressurizing the chamber; (e) generating and holding a first temperature distribution such that the solvent is supersaturated in the first region of the chamber and such that there is a first temperature gradient between the nucleation center and the GaN source material such that GaN crystal grows on the nucleation center; and (f) generating a second temperature distribution in the chamber such that the solvent is supersaturated in the first region of the chamber and such that there is a second temperature gradient between the nucleation center and the GaN source material such that GaN crystal grows on the nucleation center, wherein the second temperature gradient is larger in magnitude than the first temperature gradient and the crystal growth rate is greater for the second temperature distribution than for the first temperature distribution.

In accordance with another aspect of the present invention, there is provided a method of forming a GaN single crystal. The method comprises (a) providing a nucleation center in a first region of a chamber having a first end; (b) providing a GaN source material in a second region of the chamber having a second end; (c) providing a GaN solvent in the chamber; (d) pressurizing the chamber to a pressure of between 5 and 80 kbar; (e) generating and holding a first temperature distribution having an average temperature between about 550° C. and about 1200° C. such that the solvent is supersaturated in the first region of the chamber and such that there is a first temperature gradient between the first end and the second end such that GaN crystal grows on the nucleation center; and (f) generating a second temperature distribution in the chamber having an average temperature between about 550° C. and about 1200° C. such that the solvent is supersaturated in the first region of the chamber and such that there is a second temperature gradient between the first end and the second end such that GaN crystal grows on the nucleation center, wherein the second temperature gradient is larger in magnitude than the first temperature gradient and the crystal growth rate is greater for the second temperature distribution than for the first temperature distribution.

In accordance with another aspect of the present invention, there is provided a method of forming a GaN single crystal. The method comprises (a) providing a nucleation center in a first region of a chamber having a first end; (b) providing a GaN source material in a second region of the chamber having a second end; (c) providing a GaN solvent in the chamber; (d) pressurizing the chamber; (e) generating and holding a first temperature distribution such that there is a first temperature gradient between the first end and the second end; and (f) generating a second temperature distribution in the chamber such that the solvent is supersaturated in the first region of the chamber and such that there is a second temperature gradient between the first end and the second end such that GaN crystal grows on the nucleation center, wherein the first temperature gradient is zero or opposite in sign from the second temperature gradient.

DETAILED DESCRIPTION OF THE PREFERRED EMBODIMENTS

Figure 1:
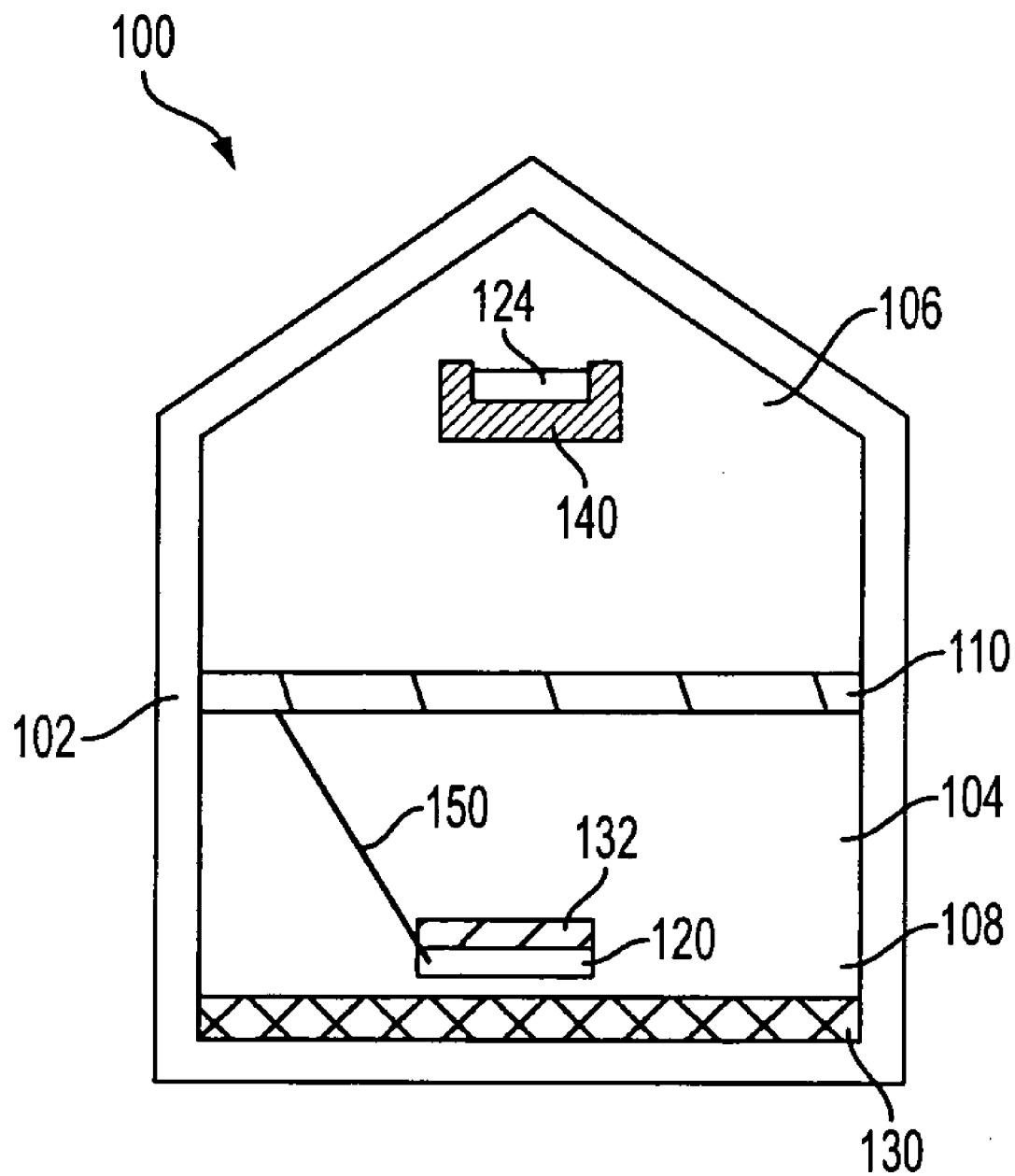
FIG. 1 is a schematic cross-sectional representation of a capsule used for making a GaN single crystal according to a preferred embodiment of the invention.

Reference will now be made in detail to presently preferred embodiments of the present invention. Wherever possible, the same reference numbers will be used throughout the drawings to refer to the same or like parts.

Crystalline composition defects refers to one or more of point defects, such as vacancies, interstitials, and impurities; one-dimensional linear defects, such as dislocations (edge, screw, mixed); two-dimensional planar defects, such as tilt boundaries and grain boundaries; and three-dimensional extended defects, such as voids, pores, pits, and cracks. Defect may refer to one or more of the foregoing unless context or language indicates that the subject is a particular subset of defect. Free of tilt boundaries or substantially free of tilt boundaries means that the crystalline composition may have tilt boundaries at an insubstantial level, or with a tilt angle such that the tilt boundaries may not be readily detectable by TEM or X-ray diffraction; or, the crystalline composition may include tilt boundaries that are widely separated from one another, e.g., by at least 2.75 millimeters or by a greater, and specified, distance. Thus, "free" or "substantially free" may be used in combination with a term, and may include an insubstantial number or trace amounts while still being considered free of the modified term, and "free" or "substantially free" may include further the complete absence of the modified term.

In a GaN crystal, there are three dimensions as represented by x,y,w characters, with w as the thickness, and x and y the dimensions of the crystal plane perpendicular to w. For a round or circular crystal, x=y=the diameter of the crystal.

As used herein, a boule may be used interchangeably with an ingot, referring to a crystal having a volume in excess of 0.2 $cm^3$ with a minimum thickness (z dimension) of 0.2 cm.

The present inventors have found that GaN nucleates very readily in supercritical ammonia and other supercritical GaN solvents so that recrystallization produces many small crystals rather than one large crystal. While small high quality GaN crystals could be grown by the methods known in the prior art, no high quality crystal larger than 2.75 mm (in the x or y dimension) has been grown by these methods. The present inventors have found that a method using an improved temperature profile including appropriate temperature gradients, together with an improved method for mounting seed crystals, is capable of overcoming these limitations.

According to embodiments of the present invention, a true single crystal may be synthesized, and grown from a single nucleus to a size of at least 2.75 mm in at least one of x and y dimensions. If the crystal is circular or somewhat circular in shape, the single crystal is at least 2.75 mm in diameter. The single crystal may be n-type, electrically conductive, optically transparent, free of lateral strain and tilt boundaries, and with a dislocation density less than about $10^4$ $cm^{-2}$. Preferably, the dislocation density is less than about $10^3$ $cm^{-2}$. Even more preferably, the dislocation density is less than about 100 $cm^{-2}$.

This large high quality gallium nitride single crystal may be grown by temperature gradient recrystallization at high pressure and high temperature in a supercritical fluid solvent. The crystal is a true single crystal, i.e., it is substantially free of tilt boundaries.

These gallium nitride crystals may be grown by temperature-gradient recrystallization in a supercritical fluid, including but not limited to ammonia, hydrazine, methylamine, ethylenediamine, melamine, or other nitrogen-containing fluid. The source material may comprise single crystal or polycrystalline GaN. The single crystal or polycrystalline GaN for the source material may be grown by any number of methods known in the art. Other forms of source material may also be used, for example, amorphous GaN or a GaN precursor such as Ga metal or a Ga compound. It is preferred that the source GaN comprise one or more particles that are sufficiently large in size so as not to pass through the openings in a baffle, described below, that separates the source region, where the source material is located, from the crystal growth region, where a nucleation center is located, of a chamber or capsule, as discussed in more detail below.

Nucleation for GaN growth may be induced on the crystal growth portion of the capsule at a nucleation center without a seed crystal, such as a portion of the container wall, or with a non-GaN seed crystal such as sapphire, for example. It is preferred, however, that a GaN seed crystal is provided, because the process is easier to control and the quality of the grown crystal is higher.

The seed crystal is preferably larger than 1 mm in at least x or y dimension and of high quality, substantially free of tilt boundaries and having a dislocation density less than about $10^8$ $cm^{-2}$, and preferably below about $10^5$ $cm^{-2}$. A variety of types of GaN seed crystals may be provided, including an epitaxial GaN layer on a non-GaN substrate such as sapphire or SiC, a free-standing GaN film grown by HVPE, sublimation, or metal organic chemical vapor deposition (MOCVD), or a crystal grown in a supercritical fluid in a previous run.

The source material and one or more seeds, if used, are placed in a pressure vessel or capsule that is divided into at least two regions by means of a porous baffle. An exemplary capsule is described in U.S. patent application Ser. No. 09/683,659 to D'Evelyn et al. filed on Jan. 31, 2002, and entitled "High Temperature Pressure Capsule For Processing Material in Supercritical Fluids", hereby incorporated by reference in its entirety.

FIG. 1 illustrates an exemplary capsule 100. The capsule 100 includes a wall 102, which can be sealed to surround a chamber 104 of the capsule 100. The chamber is divided into a first region 108 and a second region 106 separated by a porous baffle 110. During crystallization growth the capsule 100 contains a seed crystal 120 or other nucleation center and a source material 124 separated from each other by the baffle 110. The source material 124 and the seed crystal 120 may be positioned in the second region 106 and the first region 108, respectively, for example. The capsule 100 also contains a solvent material 130. During the growth process, described below, a grown crystal 132 is grown on the seed crystal 120 and the solvent is in a supercritical state.

The baffle 110 may comprise, for example, a plate with a plurality of holes in it, or a woven metal cloth. The fractional open area of the baffle 110 may be between 1% and 50%, and preferably between about 5% and about 40%. Transport of nutrient from the source material 124 to the seed crystal 120 or grown crystal 132 is optimized in the solvent as a supercritical fluid if the colder portion of the capsule 100 is above the warmer portion, so that self-convection stirs the fluid. In many solvents the solubility of GaN increases with temperature, and in this case the source material 124 should be placed in the bottom warmer portion of the capsule and the seed crystal 120 in the top colder portion of the capsule.

The seed crystal 120 is preferably hung, for example, by a wire (150) through a hole drilled through the seed, so as to allow crystal growth in all directions with a minimum of interference from wall 102 or other materials. The hole may be drilled by a laser, a diamond or abrasive drill, or an ultrasonic drill, for example. The seed crystal 120 may alternatively be hung by tying a wire around one end of the seed.

In the case of some solvents, however, the solubility of GaN decreases with temperature. In this case the seed crystal 120 should be placed in the lower warmer portion of the capsule and the source material 124 in the upper colder portion of the capsule. The source material 124 is preferably placed in a porous basket 140 displaced from the baffle 110 rather than immediately contacting the baffle 110, as the latter arrangement may impede transport of fluid and nutrient through the baffle 110.

A mineralizer may also be added to the capsule 100, in order to increase the solubility of GaN in the solvent, either together with the source material 124 or separately. The mineralizer may comprise at least one of (i) alkali and alkaline-earth nitrides, such as $Li_3N$, $Mg_3N_2$, and $Ca_3N_2$; (ii) amides, such as $LiNH_2$, $NaNH_2$, and $KNH_2$; (iii) urea and related compounds; (iv) ammonium salts, such as $NH_4F$ and $NH_4Cl$; (v) halide, sulfide, or nitrate salts, such as NaCl, $Li_2S$, or $KNO_3$; (vi) azide salts, such as $NaN_3$; (vii) other Li salts; (viii) combinations of the above; and (ix) compounds formed by chemical reaction of at least one of the above with Ga and/or GaN.

Optionally, a dopant source is also added to capsule 100, in order to provide n-type or p-type GaN crystals. Adventitious impurities such as oxygen or carbon will otherwise normally render the crystals n-type. Dopants such as Si (n-type) and Mg or Zn (p-type) may be added as impurities in the source GaN. Alternatively, the dopants may be added as metals, salts, or inorganic compounds, such as Si, $Si_3N_4$, $SiCl_4$, $Mg_3N_2$, $MgF_2$, Zn, $ZnF_2$, or $Zn_3N_2$.

The capsule 100 is filled with a solvent 130 that will comprise a supercritical fluid under processing conditions, such as, for example, ammonia, hydrazine, methylamine, ethylenediamine, melamine, or other nitrogen-containing fluid. In a preferred embodiment ammonia is employed as the solvent 130. Of the free volume in the capsule, i.e., the volume not occupied by the source material, seed(s), and baffle), between 25% and 100%, or preferably between 70% and 95%, is filled with solvent 130 and the capsule 100 is sealed.

Methods for filling and sealing the capsule are described in U.S. application Ser. No. 09/683,659, filed Jan. 31, 2002 mentioned above, for example. For example, the capsule 100 may be cooled to a temperature at which the solvent 130 is either a liquid or solid. Once the capsule 100 is sufficiently cooled, a solvent source is placed in fluid communication with the open chamber of the capsule 100 and solvent is introduced into the chamber, which is open at this point, by either condensation or injection. After a desired amount of solvent 130 is introduced into the open chamber, the chamber is sealed. The chamber may be sealed, for example, by pinching off or collapsing a portion of the wall 102 to form a weld.

The sealed capsule 100 is placed in a vessel capable of generating temperatures between about 550° C. and about 3000° C., or preferably between about 550° C. and about 1200° C. and a pressure between about 5 kbar and about 80 kbar, or preferably between about 5 kbar and about 20 kbar. An exemplary pressure vessel is described in U.S. application Ser. No. 09/683,658, to D'Evelyn et al. filed on Jan. 31, 2002, and entitled "Improved Pressure Vessel", hereby incorporated by reference in its entirety.

Figure 2:
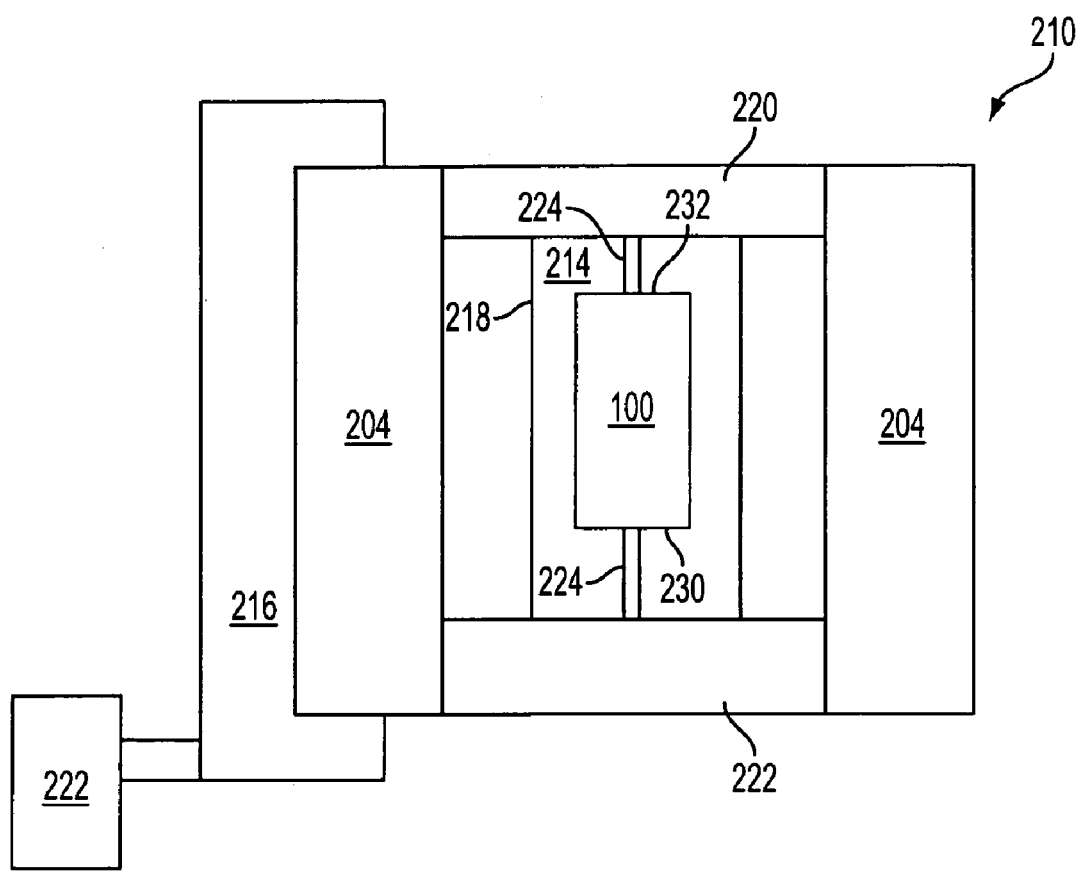
FIG. 2 is a schematic cross-sectional representation of a pressure vessel used for making a GaN single crystal according to a preferred embodiment of the invention.

FIG. 2 illustrates a pressure vessel 210, with enclosed capsule 100. The pressure vessel 210 illustrated in FIG. 2 is a hydraulic press with a die. Alternatively, the pressure vessel may comprise a multi-anvil press or may comprise a die and reinforced end flanges as described in U.S. application Ser. No. 09/683,658 mentioned above.

The pressure vessel 210 contains a pressure medium 214 enclosed by compression die 204 and top and bottom seals 220 and 222. The pressure medium may be, for example, NaCl, NaBr or NaF.

The pressure vessel 210 includes a wattage control system 216 for controlling the heating of the capsule 100. The wattage control system 216 includes a heating element 218 to provide heating to the capsule 100, and a controller 222 for controlling the heating element 218. The wattage control system 216 also preferably includes at least one temperature sensor 224 proximate to the capsule 100 for generating temperature signals associated with the capsule 100.

The pressure vessel 210 is preferably arranged to provide a temperature distribution, i.e., the temperature as a function of the position within the capsule chamber, within the capsule chamber, including a temperature gradient within the capsule 100. In one embodiment, the temperature gradient may be achieved by placing the capsule 100 closer to one end of the cell (the region within the pressure vessel 210) than the other. Alternatively, the temperature gradient is produced by providing at least one heating element 218 having a non-uniform resistivity along its length. Non-uniform resistivity of the at least one heating element 218 may be provided, for example, by providing at least one heating element 218 having a non-uniform thickness, by perforating the at least one heating element 218 at selected points, or by providing at least one heating element 218 that comprises a laminate of at least two materials of differing resistivity at selected points along the length of the at least one heating element 218. In one embodiment, the at least one temperature sensor 224 comprises at least two independent temperature sensors provided to measure and control the temperature gradient between the opposite ends 230, 232 of the capsule 100. In one embodiment, closed-loop temperature control is provided for at least two locations within the cell. The at least one heating element 218 may also comprise multiple zones which may be individually powered to achieve the desired temperature gradient between two ends of the capsule 100. An exemplary apparatus and method for providing independent temperature control of at least two locations within a high pressure cell is described in U.S. patent application "High pressure/high temperature apparatus with improved temperature control for crystal growth," to D'Evelyn et al. filed on Dec. 18, 2002, which is incorporated by reference in its entirety.

The capsule 100 is heated to the growth temperature, preferably between about 550° C. and 1200° C., at an average rate between about 1° C./hr and 1000° C./hr. A temperature gradient may be present in the capsule, due to asymmetric placement of the capsule in the cell, non-symmetric heating, or the like, as described above with respect to the pressure cell 210. This temperature gradient has the effect of creating a supersaturation throughout the heating sequence, which the inventors have found promotes spontaneous nucleation.

In an embodiment of the present invention the temperature gradient at the growth temperature is initially held small, less than about 25° C. and preferably less than about 10° C., for a period between about 1 minute and 2 hours, in order to allow the system to equilibrate in an equilibrium stage. The temperature gradient as used in this application is the difference in the temperature at the ends of the capsule, for example, where the control thermocouples are located. The temperature gradient at the position of the seed crystal 120 or nucleation center with respect to the temperature at the position of the source material 124 is likely to be somewhat smaller.

Optionally, the temperature gradient is set in the equilibrium stage to be opposite in sign to that where crystal growth occurs on the nucleation center (i.e., so that etching occurs at the nucleation center and growth occurs on the source material) so as to etch away any spontaneously-nucleated crystals in the region of the capsule where the nucleation center is provided that may have formed during heating. In other words, if the crystal growth occurs for a positive temperature gradient, then the temperature gradient is set to be negative, and vice versa.

After this equilibration period, a growth period may be provided where the temperature gradient is increased in magnitude and has a sign such that growth occurs at the seed crystal at a greater rate. For example the temperature gradient may be increased at a rate between about 0.01° C./hr and 25° C./hr, to a larger value where growth is faster. During the crystal growth the temperature gradient may be held at a magnitude of between 5° C. and 30° C. and may be adjusted upward or downward during growth. Optionally, the temperature gradient may be changed to have a sign opposite to the sign where growth occurs at the seed crystal. The sign of the gradient may be reversed one or more additional times in order to alternately etch away any spontaneously-formed nuclei and promote growth on one or more nucleation centers or seed crystals 120.

At the conclusion of the growth period the temperature of the capsule may be ramped down at a rate between about 1° C./hr and 1000° C./hr, and preferably between about 1° C./hr and 300° C./hr so as to minimize thermal shock to the grown crystal 132. The cell, including the capsule and pressure medium, is removed from the pressure vessel 210 and the capsule 100 is removed from the cell.

The solvent 130 may be conveniently removed by chilling the capsule to reduce the vapor pressure of the solvent below 1 bar, puncturing the capsule, then allowing it to warm so that the solvent evaporates. The capsule is cut open and the grown crystal(s) removed. The crystal(s) may be washed by an appropriate wash, such as, for example, at least one of water, alcohol or other organic solvent, and mineral acids to remove mineralizer.

The quality of the single crystal may be indicated by characterization techniques, such as photoluminescence, which occurs at the band edge at room temperature for GaN. The crystal may be further processed and sliced into one or more wafers, lapped, polished, and chemically polished. This single crystal gallium nitride crystal, and wafers formed therefrom, are useful as substrates for electronic and optoelectronic devices.

The crystal may be characterized by standard methods that are known in the art. For determining the dislocation density, Cathodoluminescence (CL) and etch pit density are convenient. CL imaging provides a non-destructive measure of dislocation density, and requires no sample preparation. Dislocations are non-radiative recombination centers in GaN, and therefore appear in CL as dark spots. One can simply measure the concentration of dark spots in CL images to determine the dislocation density.

A second convenient method, which may be more definitive in some cases, is etch pit density. One such etch method, for example, is a vapor-phase HCl etch, as described by T. Hino et al., Appl. Phys. Lett. 76, 3421 (2000) incorporated by reference.

Both of these methods were applied to the Ga face of a sample of commercial-grade HVPE GaN dislocation densities (dark-spot densities or etch pit densities) of $1\text{-}2\times10^7\ cm^{-2}$ were obtained, in excellent agreement with the values reported by the vendor and other researchers on similar material.

The optical absorption and emission properties of the grown GaN can be determined by optical absorption and photoluminescence spectroscopies, as are well known in the art. The electrical properties can be determined by Van der Pauw Hall effect measurements, by mercury-probe CV, and by hot-probe techniques.

The crystal may be sliced into one or more wafers by methods that are well known in the art. The GaN crystal or wafer is useful as a substrate for epitaxial $Al_xIn_yGa_{1-x-y}N$ films where $0\leq x\leq 1$, $0\leq y\leq 1$ and $0\leq x+y\leq 1$, light emitting diodes, laser diodes, photodetectors, avalanche photodiodes, transistors, diodes, and other optoelectronic and electronic devices. Exemplary methods of forming homoepitaxial light emitting diodes and laser diodes on a GaN substrate are described, for example, in U.S. patent application Ser. No. 09/694,690, filed Oct. 23, 2000 by D'Evelyn et al., "Homoepitaxial GaN-based light emitting device and method for producing," which is hereby incorporated by reference. Exemplary methods of forming homoepitaxial photodetectors on a GaN substrate are described, for example, in U.S. patent application Ser. No. 09/839,941, filed Apr. 20, 2001 by D'Evelyn et al., "Homoepitaxial GaN-based photodetector and method for producing," which is hereby incorporated by reference. Exemplary methods of forming avalanche photodiodes on a GaN substrate are described, for example, in U.S. patent application "Avalanche photodiode for use in harsh environments," U.S. patent application Ser. No. 10/314,986 to Sandvik et al. filed on Dec. 10, 2002, which is hereby incorporated by reference.

The above described embodiments provide improved nucleation control by including an equilibration period in the temperature program, in which the temperature gradient is substantially reduced, or even set to be zero or negative, with respect to the gradient during crystal growth, and by hanging the seed crystal within the growth chamber. The improved crystal growth method provides high quality, large area GaN crystals.

A GaN single crystal formed by the above method was characterized using etch pit density measurements, photoluminescence, and optical absorption techniques. The single crystal formed is characterized by a dislocation density below $100\ cm^{-1}$, a photoluminescence spectrum which peaks at a photon energy of between about 3.38 and about 3.41 eV at a crystal temperature of 300° K, and has an optical absorption coefficient below $5\ cm^{-1}$ for wavelengths between 700 nm (red) and 465 nm (blue).

EXAMPLES

The following Comparative Examples (Comparative Examples 1-3) are provided for comparison to the Examples (Examples 1-4). The Comparative Examples do not constitute prior art to the present invention, but are provided for comparison purposes.

Comparative Example 1

0.1 g of $NH_4F$ mineralizer was placed in the bottom of a 0.5 inch diameter silver capsule. A baffle with 5.0% open area was placed in the middle portion of the capsule, and 0.31 g of polycrystalline GaN source material was placed in the upper half of the capsule. The capsule was then enclosed within a filler/sealing assembly together with a 0.583 inch diameter steel ring. The capsule and filler/sealing assembly were transferred to a gas manifold and filled with 0.99 g of ammonia. Next, a plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke high pressure high temperature (HPHT) apparatus. The cell was heated to approximately 700° C. and held at this temperature for 55 hours, with a temperature gradient of approximately 85° C. The cell was then cooled and removed from the press. Upon opening the capsule after venting of the ammonia, numerous spontaneously-nucleated crystals were observed at the bottom of the capsule. One crystal approximately 0.36 mm in diameter was selected at random and etched in 10% HCl in Ar at 625° C. for 30 min. No etch pits were observed. The area of the exposed c-face was approximately $5.3 \times 10^{-4}$ cm$^2$, indicating that the etch pit density was less than $(1/(5.3 \times 10^{-4}$ cm$^2))$ or 1900 cm$^{-2}$. By contrast, the identical etching treatment was applied to a 200 μm-thick piece of GaN grown by hydride/halide vapor phase epitaxy (HVPE), and an etch pit density of $2 \times 10^7$ cm$^{-2}$ was observed on the Ga face.

Comparative Example 2

Three seeds, weighing 3-4 mg each, were placed in the bottom of a 0.5 inch diameter silver capsule along with 0.10 g of NH$_4$F mineralizer. A baffle with 5.0% open area was placed in the middle portion of the capsule, and 0.34 g of polycrystalline GaN source material was placed in the upper half of the capsule. The capsule was then enclosed within a filler/sealing assembly together with a 0.675 inch diameter steel ring. The capsule and filler/sealing assembly were transferred to the gas manifold and filled with 1.03 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 15° C./min to approximately 500° C., then at 0.046° C./min to 700° C., and held at the latter temperature for 6 hours, with a temperature gradient of approximately 28° C. The cell was then cooled and removed from the press. Upon opening the capsule after venting of the ammonia, numerous spontaneously-nucleated crystals were observed at the bottom of the capsule and, despite the very slow heating rate, very little growth on the seeds occurred, relative to growth on spontaneously-nucleated crystals.

Comparative Example 3

A GaN seed, weighing 10.4 mg, was placed in the bottom of a 0.5 inch diameter silver capsule along with 0.04 g of NH$_4$F mineralizer. A baffle with 5.0% open area was placed in the middle portion of the capsule, and 0.74 g of polycrystalline GaN source material was placed in the upper half of the capsule. The capsule was then enclosed within a filler/sealing assembly together with a 0.675 inch diameter steel ring. The capsule and filler/sealing assembly were transferred to the gas manifold and filled with 1.14 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 15° C./min to approximately 500° C., then at 0.05° C./min to 680° C., and held at the latter temperature for 53 hours, with a temperature gradient of approximately 70° C. The cell was then cooled and removed from the press. Upon opening the capsule after venting of the ammonia, numerous spontaneously-nucleated crystals were observed at the bottom of the capsule despite the very slow heating rate. The seed did grow significantly, to a weight of 41.7 mg and a diameter of about 2.5 mm. However, the weight of spontaneously-nucleated crystals was more than 10× the weight increase of the seed.

Example 1

Figure 3:
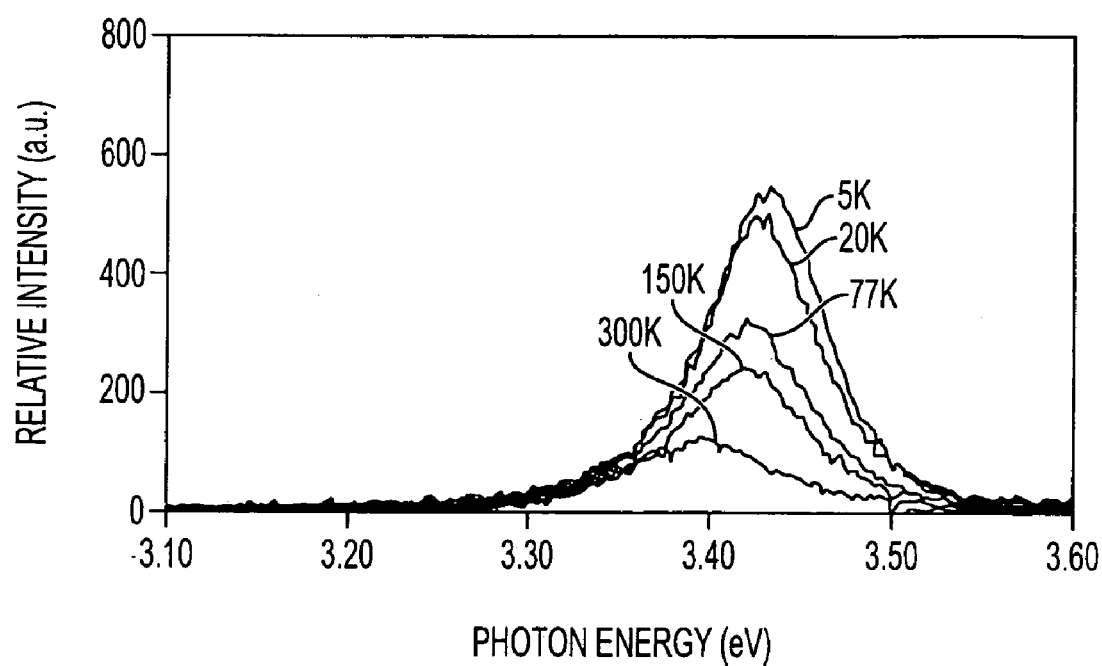
FIG. 3 is a series of photoluminescence spectra of a GaN crystal according to a preferred embodiment of the invention.

A small hole was drilled by a high-power laser through a GaN seed crystal weighing 19.7 mg. The seed was hung by a 0.13-mm silver wire from a silver baffle with a 35% open area and placed in the lower half of a 0.5 inch diameter silver capsule along with 0.10 g of NH$_4$F mineralizer. 0.74 g of polycrystalline GaN source material was placed in the upper half of the capsule. The capsule was then enclosed within a filler/sealing assembly together with a 0.583 inch diameter steel ring. The capsule and filler/sealing assembly were transferred to a gas manifold and filled with 0.99 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at a rate of about 11° C./min until the temperature of the bottom of the capsule was approximately 700° C. and the temperature of the top half of the capsule was approximately 660° C., as measured by type K thermocouples. The current through the top half of the heater was then increased until the temperature gradient ΔT decreased to zero. After holding at ΔT=0 for 1 hour, the temperature of the top half of the capsule was decreased at 5° C./hr until ΔT increased to approximately 35° C., and the temperatures were held at these values for 78 hr. The cell was then cooled and removed from the press. Upon opening the capsule after venting of the ammonia, the seed weight was observed to have increased to 33.4 mg. The crystal was characterized by photoluminescence, using a 266 nm excitation (frequency-quadrupled YAG). The spectra at several temperatures are shown in FIG. 3. Specifically the crystal sample was characterized by photoluminescence at temperatures of 5K, 20K, 77K and 300K. At all temperatures in the range of 5K-300K, the luminescence peak occurs between 3.38 and 3.45 eV.

Example 2

A GaN seed crystal weighing 12.6 mg, obtained from a previous run, was hung through a laser-drilled hole by a 0.13-mm silver wire from a silver baffle with a 35% open area and placed in the lower half of a 0.5 inch diameter silver capsule. 0.10 g of NH$_4$F mineralizer and 1.09 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 0.95 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at a rate of about 11° C./min until the temperature of the bottom of the capsule was approximately 700° C. and the temperature of the top half of the capsule was approximately 640° C., as measured by type K thermocouples. The current through the top half of the heater was then increased until the temperature gradient $\Delta T$ decreased to zero. After holding at $\Delta T=0$ for 1 hour, the temperature of the top half of the capsule was decreased at 5° C./hr until $\Delta T$ increased to approximately 50° C., and the temperatures were held at these values for 98 hr. The cell was then cooled and removed from the press. Upon opening the capsule after venting of the ammonia, the seed had grown to a weight of 24.3 mg. The crystal was then etched in 10% HCl in Ar at 625° C. for 30 min. Some etch pits were observed on the c-face above the region of the seed, with an etch pit density of about $10^6$ cm$^{-2}$. However, the areas that grew laterally with respect to the seed were free of etch pits. The area of newly laterally-grown GaN was approximately $3.2 \times 10^{-2}$ cm$^2$, indicating that the etch pit density was less than $(1/3.2 \times 10^{-2}$ cm$^2)$ or 32 cm$^{-2}$.

Example 3

Two GaN seeds, weighing 48.4 mg and 36.6 mg and obtained from a previous run, were hung through laser-drilled holes by a 0.13-mm silver wire from a silver baffle with a 35% open area and placed in the lower half of a 0.5 inch diameter silver capsule. 0.10 g of NH$_4$F mineralizer and 1.03 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 1.08 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 11° C./min until the temperature of the bottom of the capsule was approximately 700° C. and the temperature of the top half of the capsule was approximately 642° C., as measured by type K thermocouples. The current through the top half of the heater was then increased until the temperature gradient $\Delta T$ decreased to zero. After holding at $\Delta T=0$ for 1 hour, the temperature of the top half of the capsule was decreased at 5° C./hr until $\Delta T$ increased to approximately 30° C., and the temperatures were held at these values for 100 hr. The cell was then cooled and removed from the press. Upon opening the capsule after venting of the ammonia, the seeds had grown to a weight of 219.8 mg. A piece broke off from the smaller of the two crystals and was selected for analysis. An optical transmission spectrum of the crystal was measured using a Cary 500i spectrometer. The transmission was greater than 60% for wavelengths ranging from red (700 cm$^{-1}$) to blue (465 cm$^{-1}$). Based on the index of refraction for GaN [G Yu et al., Applied Physics Letters 70, 3209 (1997)] and the thickness of the crystal, 0.206 mm, the optical absorption coefficient was less than 5 cm$^{-1}$ over the same wavelength range. The crystal was determined to have n-type electrical conductivity by means of a hot-point probe measurement. The crystal was then etched in 10% HCl in Ar at 625° C. for 30 min. The entire crystal was free of etch pits. The area of the c-face of the crystal was approximately $4.4 \times 10^{-2}$ cm$^2$, indicating that the etch pit density was less than $(1/4.4 \times 10^{-2}$ cm$^2)$ or 23 cm$^{-2}$.

Example 4

A GaN seed weighing 25.3 mg, obtained from a previous run, was hung through a laser-drilled hole by a 0.13-mm silver wire from a silver baffle with a 35% open area and placed in the lower half of a 0.5 inch diameter silver capsule. 0.10 g of NH$_4$F mineralizer and 0.98 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 1.07 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 11° C./min until the temperature of the bottom of the capsule was approximately 700° C. and the temperature of the top half of the capsule was approximately 648° C., as measured by type K thermocouples. The current through the top half of the heater was then increased until the temperature gradient $\Delta T$ decreased to 3° C. After holding at $\Delta T=3$° C. for 1 hour, the temperature of the top half of the capsule was decreased at 5° C./hr until $\Delta T$ increased to approximately 30° C., then decreased further at 2.5° C./hr until $\Delta T$ increased to approximately 60° C. and the temperatures were held at these values for 20 hr. The cell was then cooled and removed from the press. Upon opening the capsule after venting of the ammonia, the seed had grown to a weight of 40.2 mg. The crystal was then etched in 50% HNO$_3$ for 30 min. A row of etch pits was observed on the c-face above the interface between the seed and new, laterally-grown material. However, the remaining areas of newly-grown GaN were free of etch pits. The area of pit-free newly grown GaN was approximately $6.9 \times 10^{-2}$ cm$^2$, indicating that the etch pit density was less than $(1/6.9 \times 10^{-2}$ cm$^2)$ or 14 cm$^{-2}$.

The improved methods for forming GaN crystal material described above enable the growth of larger high-quality GaN crystals. These improved GaN crystals enable the fabrication of better-performing electronic and optoelectronic devices, with improved efficiency, reliability, yields, high power performance, breakdown voltage, and reduced dark current and noise.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A GaN single crystal having a thickness w and dimensions x and y defining a crystal plane perpendicular to the thickness w, wherein the GaN single crystal is at least about 2.75 millimeters in at least one dimension x or y, with a dislocation density less than about $10^4$ cm$^{-2}$, and substantially free of tilt boundaries, wherein the single crystal is a boule.

2. The GaN single crystal of claim 1, wherein the GaN single crystal is grown from a single seed or nucleus.

3. The GaN single crystal of claim 1, wherein the single crystal is optically transparent, with an optical absorption coefficient below 100 cm$^{-1}$ at wavelengths between 465 and 700 nm.

4. The GaN single crystal of claim 3, wherein the optical absorption coefficient is below 5 cm$^{-1}$ at wavelengths between 465 and 700 nm.

5. The GaN single crystal of claim 1, wherein the single crystal comprises one of n-type and p-type semiconductor material.

6. The GaN single crystal of claim 5, wherein the single crystal comprises an n-type semiconductor material and is optically transparent, with an optical absorption coefficient below 100 cm$^{-1}$ at wavelengths between 465 and 700 nm.

7. The GaN single crystal of claim 1, wherein the single crystal has a photoluminescence spectrum peaking at a photon energy of between about 3.38 and about 3.41 eV at a crystal temperature of 300 K.

8. The GaN single crystal of claim 1, wherein the dislocation density is less than about 1000 cm$^{-2}$.

9. The GaN single crystal of claim 8, wherein the dislocation density is less than about 100 cm$^{-2}$.

10. A semiconductor structure comprising a GaN single crystal having a thickness w and dimensions x and y defining a crystal plane perpendicular to the thickness w, the GaN single crystal is at least about 2.75 millimeters in at least a dimension x or y, has a dislocation density less than about 10$^4$ cm$^{-2}$, and is substantially free of tilt boundaries, wherein the single crystal is a boule.

11. The semiconductor structure of claim 10, wherein the GaN single crystal is grown from a single seed or nucleus.

12. The semiconductor structure of claim 10, wherein the single crystal is optically transparent, with an optical absorption coefficient below 100 cm$^-$ at wavelengths between 465 and 700 nm.

13. The semiconductor structure of claim 12, wherein the optical absorption coefficient is below 5 cm$^{-1}$ at wavelengths between 465 and 700 nm.

14. The semiconductor structure of claim 10, wherein the single crystal comprises one of n-type and p-type semiconductor material.

15. The semiconductor structure of claim 14, wherein the single crystal comprises an n-type semiconductor material and is optically transparent, with an optical absorption coefficient below 100 cm$^{-1}$ at wavelengths between 465 and 700 nm.

16. The semiconductor structure of claim 10, wherein the single crystal has a photoluminescence spectrum peaking at a photon energy of between about 3.38 and about 3.41 eV at a crystal temperature of 300K.

17. The semiconductor structure of claim 10, wherein the dislocation density is less than about 1000 cm$^{-2}$.

18. The semiconductor structure of claim 17, wherein the dislocation density is less than about 100 cm$^{-2}$.

* * * * *